(12) United States Patent
McIntyre et al.

(10) Patent No.: US 10,006,977 B2
(45) Date of Patent: Jun. 26, 2018

(54) OPEN MAGNETIC RESONANCE IMAGING

(71) Applicant: The Texas A&M University System, College Station, TX (US)

(72) Inventors: Peter McIntyre, Bryan, TX (US); Akhdiyor Sattarov, College Station, TX (US)

(73) Assignee: The Texas A&M University System, College Station, TX (US)

( * ) Notice: Subject to any disclaimer, the term of this patent is extended or adjusted under 35 U.S.C. 154(b) by 416 days.

(21) Appl. No.: 14/821,972

(22) Filed: Aug. 10, 2015

(65) Prior Publication Data

US 2016/0245886 A1 Aug. 25, 2016

Related U.S. Application Data

(60) Provisional application No. 62/035,984, filed on Aug. 11, 2014.

(51) Int. Cl.
*G03G 15/20* (2006.01)
*G01R 33/3815* (2006.01)
*H01F 6/06* (2006.01)
*H01F 41/04* (2006.01)
*G01R 33/38* (2006.01)

(52) U.S. Cl.
CPC ..... *G01R 33/3815* (2013.01); *G01R 33/3802* (2013.01); *G01R 33/3808* (2013.01); *H01F 6/06* (2013.01); *H01F 41/048* (2013.01)

(58) Field of Classification Search
CPC ........... G03G 15/2028; G03G 15/6573; G03G 15/2085; G03G 15/2053; B65H 2220/01
USPC ......................................................... 324/322
See application file for complete search history.

(56) References Cited

U.S. PATENT DOCUMENTS

2008/0164878 A1* 7/2008 Morich .............. G01R 33/3875 324/320
2009/0237192 A1* 9/2009 Hollis ................ G01R 33/3806 335/299

OTHER PUBLICATIONS

Translation of Nakayama (JP 2014-161427 A) listed in the IDS, publication date: Sep. 8, 2014.*

* cited by examiner

*Primary Examiner* — Walter L Lindsay, Jr.
*Assistant Examiner* — Frederick Wenderoth
(74) *Attorney, Agent, or Firm* — Winstead PC

(57) ABSTRACT

Embodiments of the invention are directed to a method for designing the arrangement of superconducting windings for an open MRI system capable of supporting the imaging sequences for CE-BMRI and to a method of coil fabrication that can make a practical magnet from the design.

7 Claims, 3 Drawing Sheets

OPEN MAGNETIC RESONANCE IMAGING

CROSS-REFERENCES TO RELATED APPLICATIONS

This Application claims the benefit under 35 U.S.C. § 119(e) of U.S. Provisional Patent Application No. 62/035,984 filed Aug. 11, 2014 which is incorporated herein by reference in its entirety as if fully set forth herein.

FIELD OF THE INVENTION

The invention is in the field of electromagnets, and is more particularly directed to superconducting electromagnets useful in magnetic resonance imaging.

BACKGROUND OF THE INVENTION

High magnetic field electromagnets have become important in various types of equipment over recent years. One important type of such equipment is medical imaging equipment, such as the type commonly referred to as magnetic resonance imaging (MRI) equipment Contrast-Enhanced Breast MRI (CE-BMRI) is a sensitive screening method for the detection of breast cancer. Studies of CE-BMRI among women in high-risk groups report sensitivities in the range 71-100%, versus mammography sensitivities in the range 20-50%. Breast MRI is more sensitive but less specific than mammography for women with dense breasts, but it is much more expensive and thus is presently not utilized for screening.

CE-BMRI is conventionally performed in a 1.5 T whole-body MRI system, utilizing a large cylindrical solenoid to a high-quality imaging field. Such systems are expensive (~$1.5 million for the system, $0.5 million for the room within the 5 G line). Additionally, whole-body MRI systems restrict access for interventional procedures such as needle biopsy and lumpectomy.

Present-day open MRI systems are based on a Helmholtz-type coil configuration, for example the 1T Panorama scanner from Phillips and the resistive passively shielded 0.6T from Fonar Corporation. However, no existing unit can provide the 1.5 T field required for CE-BMRI sequences. Thus, there is a need for MRI systems that can provide the appropriate signal and thereby field strength required for applications such as CE-BMRI, while at the same time providing access to the patient during the procedure.

SUMMARY OF THE INVENTION

An embodiment of the invention is directed to a method for designing the arrangement of superconducting windings for an open MRI system capable of supporting the imaging sequences for CE-BMRI. Another embodiment of the invention is directed to a method of coil fabrication that can make a practical magnet from the design. A key motivation in the invention is to reduce system cost compared to that of whole-body MRI systems, so that CE-BMRI can be affordable for well-patient screening. Cost reduction requires both reducing the cost of the technical system and reducing the domain of the 5 G limit that governs placement in hospitals and clinics. CE-BMRI requires that before-and-after images be taken for both breasts, so the volume-of-interest (VOI) must include both breasts. The open-MRI approach also offers significant benefit for MRI-guided needle biopsy and lumpectomy, and for MRI-guided interstitial thermal ablation of a tumor.

Open MRI of the breast requires that the magnet must produce a region homogeneous magnet field that is actually outside the magnet itself, centered in a cavity in the end surface of its structure. That would at first appear to be impossible, but it is not. It requires that the windings include domains of push-pull currents that produce flux jets. Convergent flux jets can be used to counteract the natural divergence of field in the end face of a magnet, to produce a locally homogeneous domain.

DESCRIPTION OF EXEMPLARY EMBODIMENTS

Figure 1:
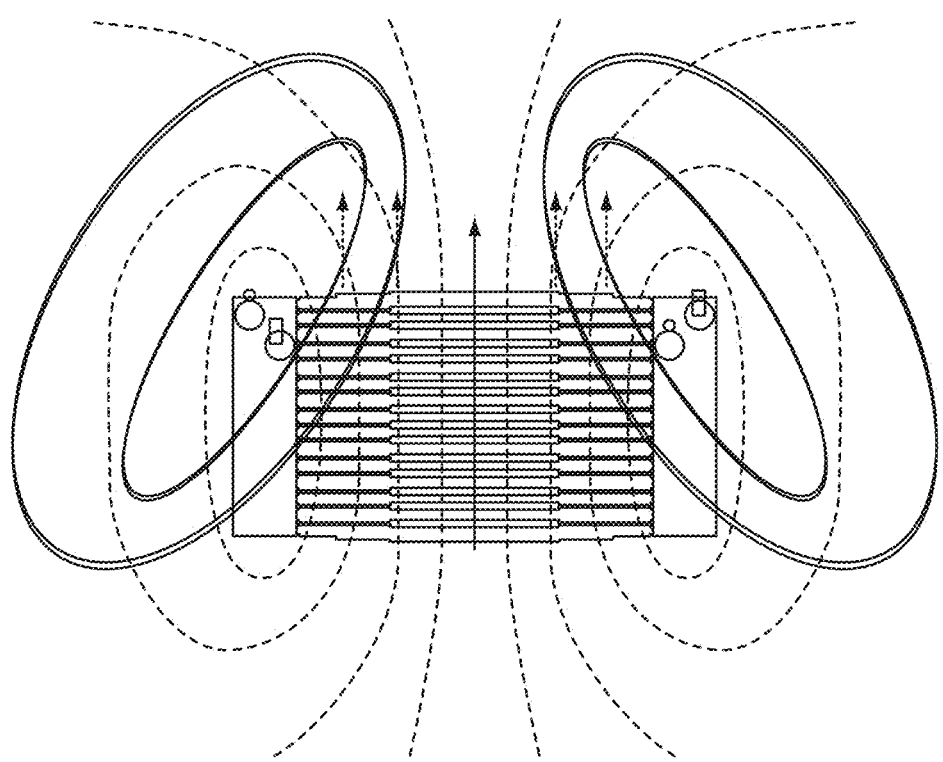
FIG. 1 shows the use of flux jets to cancel the divergence of magnetic fields in the end face of a solenoidal winding.

An embodiment of the claimed invention is directed to a superconducting MRI magnet, consisting of a plurality of planar superconducting windings disposed around a common central axis, oriented with their planes perpendicular to the central axis, in which the conductors within the windings all carry the same current, the windings are connected in electrical series, and the number of turns in each winding is in general different from the number of turns in other windings. In certain embodiments, the number of turns $N_i$ in each winding is chosen by an algorithm so that the superposition of the magnetic field distributions produced by all windings selectively cancels the multipole field components in the magnetic field distribution in a defined target region.

In an embodiment of the claimed invention, the defined target region is a spherical region centered on the central axis, located outside the region interior to any windings, for example in a geometry in which a patient could lie supine or prone upon the end face of the magnet structure, so that the target region would be centered inside his body. The windings in this case are typically nested circular hoops each of constant cross section. In other embodiments, the defined target region is a pair of spherical regions disposed in a geometry appropriate to define the locations of a woman's breasts. In this case the windings are typically a nested set of planar oblong or racetrack hoops each of constant cross section.

An embodiment of the invention is directed to an algorithm for optimizing the choice of winding turns $N_i$ for each winding so that the vector $\vec{N} = \{N\_i\}$ produces a superposition of fields that cancels a selected multipole of the field distribution in the target region. The field distribution produced by the coil elements in the target region is calculated using Biot-Savart integration, which is familiar to one practiced in the art. The algorithm consists of decomposing the field distributions produced by each winding in the target region, and extracting a vector $\vec{N}$ that cancels a specific multipole using matrix methods that are familiar to one practiced in the art.

Another embodiment is directed an algorithm by which to iteratively calculate a set of currents that cancel all desired multipoles, sufficient to produce the desired level of homogeneity in the target region. The algorithm utilizes a Gramm- Schmidt method, familiar to one practiced in the art, to iteratively solve for a set of currents that cancel a desired multipole, then those currents are used to produce an orthogonal choice of currents that also cancel one additional multipole, and so on, following the procedure described in Equations 1-4 set forth below.

A further embodiment is directed to an algorithm that calculates the fields produced by the magnetization of magnetically permeable steel elements that may be disposed in the region of the magnet. Calculation of the magnetization distribution and the fields produced by the magnetization distribution in the target region must be done using a numerical finite-element or finite-difference code, based upon the method of relaxation. The algorithm uses such a code to calculate the magnetization field distribution, and then solves for the inverse solution by which the set of currents in the coil elements can be changed to cancel the effect of the magnetization fields and restore homogeneity in the target region. The changes in current in turn change the magnetizations, and so the algorithm must be operated iteratively until it converges upon a homogeneous solution. The method is defined by Equations 5-7 set forth below.

An embodiment of the invention is directed to a structure for the windings, in which the coil is subdivided into a stack of parallel planar coil subassemblies. The planar coil subassemblies stack face-to-face, with fiducial pins that co-locate them, so that the entire magnet coil is assembled by stacking the subassemblies and compressing them stably either by metal fixtures or welding. In a further embodiment, each subassembly consists of a set of coil elements that are coplanar, nested sequentially in radius. Each subassembly contains a baseplate and a set of removable metal hoops, each shaped to define the inner boundary of a particular coil element. The baseplate is machined with a set of grooves such that each hoop fits into a groove in the baseplate. Starting with the innermost coil element, the hoop for a given winding element is installed in the baseplate and secured by either clamps or welding, then superconducting wire or cable is wound onto the hoop with the appropriate number of turns Nn, then the next hoop is installed and a face ring is installed that spans between those two hoops to enclose the now-complete coil element. The procedure is repeated until all coil elements are wound onto the baseplate. The subassembly provides stress management of Lorentz forces pushing radially and axially on each winding. The Lorentz forces are intercepted on the interlocking box formed by the baseplate, flanking hoops, and face ring, so that they cannot be passed to neighboring windings. The overall pattern of Lorentz stress is directed outward radially and inward axially. The axial forces are supported under compression of the hoops in the stack of subassemblies. The radial forces accumulate through the baseplate and face rings, with maximum total Lorentz force at the outermost surface of the assembly.

The leads from all windings are brought out in a single channel to the outermost hoop enclosing the outermost coil element. The leads are disposed on an electrically insulated bracket located on the outermost hoop, so that the splice joints that connect windings can be spliced at an accessible location and the voltage across each winding can be sensed by connecting sense wires to each splice joint. Quench heaters are bonded to the baseplate for each winding, consisting of a laminar sandwich of resistive foil captured within two layers of mica paper or other high-temperature electrical insulating material. The quench heater leads from all windings are conveyed out to a second electrically insulated bracket located on the outermost hoop, where they are accessible for connection to control equipment that can energize them when necessary to force a quench in all windings.

An aspect of the invention is directed to a stress collar, and means for preloading the coil assembly. The stress collar is a cylindrical shell of a metal alloy with high modulus, high yield strength, and a coefficient of thermal expansion by which it shrinks more than the metal of the subassembly structure, with inner radius that is a close fit to the cylindrical coil assembly. The means of preloading the coil assembly consists of a hoop-shaped bladder, made by seam-welding two thin metal foils, curved to form a hoop of radius slightly larger than that of the coil assembly and slightly smaller than that of the stress collar, with a width equal to the axial length of the coil assembly and stress collar. The interior space between the two foils is a hermetic bladder, into which a single penetration is made with a welded feed tube, so that the bladder can be filled with a molten metal and the molten metal can be pressurized to deliver uniform preload to the entire outer surface of the subassembly. The metal to be used as molten filling is chosen to have a low melt point (for example the family of Woods metal alloys) and near-zero change in volume from melt temperature to zero Kelvin. Once the stress collar and bladder are assembled onto the coil assembly, the entire system is heated above melt temperature for the metal alloy filling, the bladder is pressurized to a pressure that is chosen so that the coil assembly cannot move when it is cold and Lorentz forces are applied in operation, and then the entire system is cooled while maintaining pressure on the metal alloy filling.

In certain embodiments, a series flow of liquid helium is provided through each of the subassemblies, with the flows to the multiplicity of subassemblies connected in parallel, so that refrigeration can be provided by a cryopump and helium flow pump.

Embodiment of the claimed invention are also directed to a configuration of steel and active coils, designed using the algorithms set forth below, that contain the fringe field produced by the magnet and return it within a compact space so that the magnet can be operated without hazard to neighboring activities. The fringe fields can be contained to 5 G within a distance no more than 4 m from the center of the magnet. It should be possible to reduce that distance to ~2.5 m, at which point the entire unit will fit within a single floor of a building, and also can be mounted on a truck for use as a mobile MRI system.

An aspect of the claimed invention is directed to a new structured-coil methodology for magnet design that is used to optimize the winding geometry to produce homogeneous field in a desired VOI. The present invention includes the ability to optimize 3-D coil distributions (needed for the double-breast VOI) and the optimization incorporates the use of ferromagnetic steel to confine fringe fields.

The methodology of the claimed design is used in 2-D to design a 1.5 T open-MRI magnet that can support abdominal imaging, with unique benefit for MR-guided interventions for cardiovascular diseases and for MR-guided high-intensity focused ultrasound (HIFU) cancer therapy. In certain embodiments, the method is also used in 3-D to design the dual-VOI magnet for CE-BMRI.

A further embodiment of the claimed invention is directed to a method of fabricating structured coils that can make it possible to build what we design. The structured coil approach requires that the windings produce much higher magnet field locally within the windings than in the VOI. Therefore, in certain embodiments high performance $Nb_3Sn$ superconducting wire is required. An embodiment of the invention is also directed to the development of a high-performance $Nb_3Sn/Cu$ wire with the strength needed for the open MRI windings.

An embodiment of the claimed invention is directed to a method for optimizing the field distribution in a target volume of interest (VOI) that is located outside of the region enclosed by the windings. This is the essence of the challenge for open-MRI, since the patient lies on a table on top of the magnet (or stands next to the magnet) so that the organ to be imaged is not inserted inside the magnet.

In conventional thinking about electromagnetics this would seem to be impossible. A solenoid winding produces an approximately uniform field in the center of its bore, but in the end face of the solenoid the field diverges as the lines of force curve to circulate around the solenoid. This is shown by the dashed lines of force shown in FIG. 1. The addition of pairs of superconducting windings, carrying equal and opposite currents, which are oriented as shown a solid double lines in FIG. 1, to produce a field distribution that actually converges in the end face of the main winding. In effect the additional pair of windings produces a flux jet that converges toward the axis as it passes through the end face. By choosing the location of such winding pairs, their currents, and the angle that the pair makes to the solenoid midplane, the converging field distribution of each pair of windings in the end face region can be controlled. The design procedure then becomes one of decomposing the field distribution of the main winding into its multipoles, and designing a set of winding pairs that kill all multipoles above l=0 to produce a field of the desired homogeneity over a target volume in the end face region.

Another embodiment of the invention is directed to a method to design a set of windings, currents, and permeable steel that achieves the above objective. The overall region that is permitted to locate windings is first fixed. This overall region is then subdivided into a mesh of N coil elements in 3-D space. Each coil element is given a distinct current $I_n$, which can take any value less than a defined maximum current $I_{max}$.

The field distribution is calculated in the target region produced by a unit current in coil element n only, following which the multipoles of that distribution in the target region is calculated. This procedure is repeated for all coil elements, so that the matrix through which the N coil elements drive the (l,m) multipoles of the field is determined. This is followed by a process of orthogonalization to determine patterns of currents for the N coil elements that kill each multipole in the target region, and ultimately the pattern of currents that produces an approximately homogeneous field in the target region.

As previously discussed, a region of space W is first defined in which to place superconducting windings. Next, a region of space F in which optimally homogeneous fields are to be produced, and a volume of interest VOI in which the magnetic field is suppressed below a 5 G limit are defined. Region W is subdivided into a set of N rectangular-cross-section coil elements, and assigned a value $J_0^i$ for the starting value of the uniform current density in the ith coil element. The VOI domain is made to be spherical (though not necessarily on the axis of the current distribution, viz. the two breast VOIs), so the field distribution $B_{0z}^i(\theta, \varphi)$ on the closed surface SOI that bounds the VOI, that is created by the ith coil element, can be expanded in terms of real spherical harmonics $b_{lm}^i$:

$$B_{0z}^i(\theta, \varphi) = \Sigma_{lm} J_0^i b_{lm}^i Y_{lm}(\theta, \varphi), \text{ with coefficients} \quad (1)$$

$$b_{lm}^i = \oint_{SOI} \frac{B_{0z}^i(\theta, \varphi)}{J_0^i} Y_{lm}(\theta, \varphi) d\Omega. \quad (2)$$

The values of the source current densities and coefficients form vectors $\vec{b_{lm}} = \{b_{lm}^i\}$ and $\vec{J_0} = \{J_0^i\}$, so that the multipole terms in the field expansion are their vector product. The term l=0 corresponds to the desired (homogeneous) dipole field, and the dipole field strength is $\vec{J_0} \cdot \vec{b_{00}}$. Finding of set of current densities that will give desirable field uniformity in the VOI is then equivalent to finding a vector $\vec{J_0}$ that is orthogonal to all vectors $\vec{b_{lm}}$ for l>0, i.e. we want $\vec{J_0} \| \vec{b_{00}}$. But the set of vectors $\vec{J_0}$ do not form an orthogonal basis in which to solve for this condition, and so a Gramm-Schmidt (G-S) procedure is used to develop an equivalent orthogonal basis.

The set of current density vectors $\vec{J_0}$ may also be used to correct field inhomogeneities in the VOI created by magnetization of passive shielding steel and active shielding coils.

Figure 2:
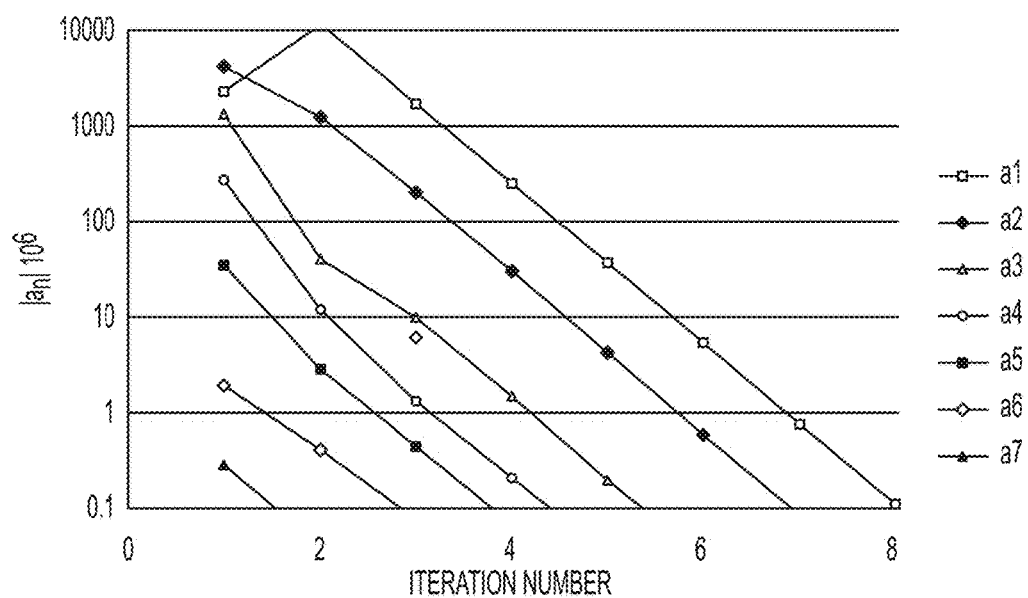
FIG. 2 shows the suppression of shielding elements induced inhomogeneity (higher order modes) vs. iteration number.

Using flux jets to suppress field inhomogeneities requires much larger fields in the windings than in the VOI (FIG. 2). In other words, the benefit comes at a price. A limit of 15 T was imposed for the field in windings, to produce a field of 1.5 T in the VOIs.

Construction of the set of vectors $\vec{J_0}$ and the G-S procedure were done using Mathematica. Magnetic fields produced by the main windings were evaluated numerically using Biot-Savart integration. In order to define a basis of coils that reflected the broken partial symmetry of the pair of VOIs, a nested set of racetrack windings was defined in which each winding consists of two 180-degree arc sections and two straight bars. Only $B_z$ was evaluated: numerical integration in azimuthal direction using 128-node Gaussian quadrature was performed for the arcs, and analytic expressions were used for the bars. Surface integrals were evaluated using 64-node Gaussian quadrature.

The G-S orthogonalization is performed for each succeeding value of the l,m sequence. For the pth step in that sequence a new set of currents $\vec{J_p}$ is calculated to kill that multipole on the SOIs, and the homogeneity over the VOI is calculated.

Inclusion of the ferromagnetic materials for passive shielding and actively shielding coils creates additional field perturbations $B_{1z}$ in the VOI. The perturbations can be compensated by adding a new set of currents $\vec{\Delta J}$:

$$B_{1z} = \Sigma_{lm} c_{lm} Y_{lm}(\theta, \varphi) \quad (3)$$

The new coefficients are defined as $$a_{lm} = \vec{\Delta J} \cdot \vec{b_{lm}} + c_{lm}. \quad (4)$$

The current perturbations required to cancel the contributions of shielding fields in the VOI can then be decomposed on the basis of each step of the G-S sequence:

$$\vec{\Delta J} = \Sigma_{lm} \alpha_{lm} \vec{J_{lm}}, \Sigma_{l'm'} \beta_{lm,l'm'} \alpha_{l'm'} = -c_{lm}, \beta_{lm,l'm'} = \vec{J_{l'm'}} \cdot \vec{b_{lm}} \quad (5)$$

Due to non-linear nature of passive shielding, the coefficients $c_{lm}$ depend on the current densities in vector $\vec{J_p}$. As a result, correction current densities must be evaluated using iterations:

$$\vec{J^q} = \vec{J_0} + \Sigma_{lm} \alpha_{lm}{}^q \cdot \vec{J_{lm}} \quad (6)$$

Starting with $\vec{J^0} = \vec{J_0}$ and $\alpha_{lm}{}^0 = 0$, coefficients $c_{lm}{}^q = c_{lm}(\vec{J^q})$ are evaluated after the qth iteration and new set of coefficients $\alpha_p{}^{q+1}$ are extracted for the corrections to current densities that will compensate them:

$$\Sigma_{l'm'} \beta_{lm,l'm'} \alpha_{pl'm'}^{q+1} = -c_{lm}^q, \quad (7)$$

$$\alpha_{lm}^q \xrightarrow[q \to \infty]{} \alpha_{lm}$$

$$c_{lm}^q \xrightarrow[q \to \infty]{} c_{lm}$$

The above method was used to optimize two magnet design cases: a single-VOI MRI magnet with nested circular windings using 2-D FEA to calculate the fields from steel shielding elements; and a double-VOI MRI magnet for breast screening using 3-D FEA to calculate fields from steel. To ensure accuracy of the calculations, surface integrals were evaluated numerically using 64-node Gaussian quadrature, and fields in the VOI were evaluated using direct integration for both coils and non-linear magnetic materials, rather than interpolation from nodal values of the solution. Less than 10 iterations were required to restore the field homogeneity in the VOI for a MRI magnet with shielding, starting from about 1000 ppm back to the level that was obtained without shielding.

A. Single-VOI Magnet for Abdominal Imaging During Surgery

The coil region W has overall dimensions 0.15 m<r<1.15 m and 0.1 m axial thickness. The coaxial windings were divided into $(4 \text{ cm}^2)^2$ equal cross-section elements. The coil region was bounded beneath and on its outer radius by an iron yoke, with a 30 cm-diameter opening in the center beneath to provide access for interventional procedures. Fringe fields were contained using a pair of reverse-current shielding windings located at the corners of the iron yoke. Two more reverse-current windings were located at r=1.9 m just inside the top and bottom steel plates. This configuration was optimized to suppress fringe field to <5 G at a 4 m radius in all directions.

The VOI was shaped as a 10 cm diameter sphere centered 10 cm above the coil boundary. A 1 ppm field homogeneity was obtained inside the VOI.

A. Dual-VOI Magnet for CE-BMRI Screening

The coil region of the magnet for breast imaging was composed of nested racetrack coils, described above. The innermost racetrack winding has 25 cm straight bar and 15 cm radius, providing enough space for thermal insulation and access from below for interventional procedures. Two coil geometries were considered:

The geometry of a coil region 1 m wide and 40 cm thick that is divided into 250 equal-cross-section winding elements. This design yields ±8 ppm field homogeneity in two VOIs that are 15 cm diameter, 25 cm apart, centered at the top surface of the coil.

The geometry of a 90° rotated 'L'-shaped coil containing nested 4 cm² square-cross-section racetracks. That design yields 5 ppm field homogeneity in the two VOIs that are 10 cm diameter, 25 cm apart.

The first case was used to test the design methodology with dual VOIs each displaced from the axis of symmetry. Full 3-D simulations were performed using simple shielding with an iron yoke shaped as in the single VOI MRI case, a pair of active shielding coils and pairs of 2 cm thick iron plates located symmetrically above and below of the top surface of the conductor region. It took 9 iterations to bring the field uniformity for the shielded case from 16,000 ppm to 7 ppm level in the two VOIs.

The second case was considered as a first step to reduce the volume of $Nb_3Sn$ conductor needed for the magnet. Preliminary screening parameters that shield to 5 G in <5 m radius were evaluated only in 2-D.

Figure 3A:
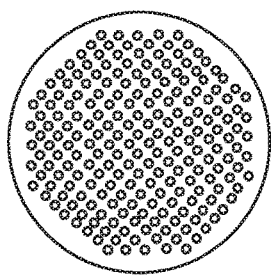
FIG. 3A shows a cross-section micrograph of 0.8 mm diameter high-performance $Nb_3Sn/Cu$ wire.
Figure 3B:
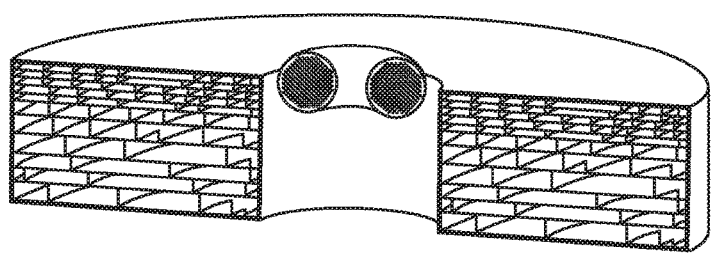
FIG. 3B shows a cross-section showing a segmented layered supported cryostat.

An embodiment of the claimed invention is directed to a stress management structure, shown in FIG. 3 for one particular coil configuration, to enclose and support the coil elements. It performs three functions:

to simplify winding and assembly process, so that each slice subassembly of coil elements is wound and vacuum-impregnated with epoxy as a separate unit, then the slices are assembled and the outer support can welded to form a rigid coil assembly;

to provide support for each coil element so that the Lorentz forces acting on that element are passed to the structure and do not accumulate in the coil elements at larger radius from one side thereby protecting the strain-sensitive $Nb_3Sn$ windings;

To provide a radial series flow path within each slice subassembly for liquid helium to flow through all coil elements to maintain them at the 5 K operating temperature.

The structure is arranged as a stack of flat disks (2 mm thick Inconel 718) and sets of concentric cylindrical collars (2 mm wall thickness). Each array of collars interlocks with the adjacent disks to provide a pier-and-beam support that intercepts the radial Lorentz stresses of each winding element and bypasses the stress past succeeding elements so that winding stresses do not accumulate.

All windings in the magnet are connected in series, with a single current $I_0$ in the wire of all windings. The desired value of current $I_n$ in each coil element is obtained by choosing a number of turns $N_n$ such that $I_n = M_n I_0$.

The results indicate that the maximum stress in any winding is ~80 MPa. The maximum stress in the support structure is 400 MPa, well below the yield strength of Inconel. The same structure can serve as a cryostat for liquid helium flowing through the concentric cooling channels in successive radial domains of each layer.

Those having skill in the art, with the knowledge gained from the present disclosure, will recognize that various changes could be made to the methods disclosed herein without departing from the scope of the present invention. Mechanisms used to explain theoretical or observed phenomena or results, shall be interpreted as illustrative only and not limiting in any way the scope of the appended claims.

What is claimed is:

1. A superconducting MRI magnet comprising:
a plurality of planar superconducting windings disposed around a common central axis, oriented with their planes perpendicular to the central axis, in which the conductors within the windings all carry the same current, the windings are connected in electrical series, and the number of turns in each winding is in general different from the number of turns in other windings.

2. The magnet of claim 1 wherein, the number of turns $N_i$ in each winding is chosen by an algorithm so that the superposition of the magnetic field distributions produced by all windings selectively cancels the multipole field components in the magnetic field distribution in a defined target region.

3. The magnet of claim 2 wherein, the defined target region is a spherical region centered on the central axis, located outside the region interior to any windings, wherein the windings are nested circular hoops each having a constant cross-section.

4. The magnet of claim 2 wherein, the defined target region is a pair of spherical regions disposed in a specific geometry appropriate wherein the windings are a nested set of planar oblong or racetrack hoops each of constant cross section.

5. A structure comprising a coil, wherein the coil is subdivided into a stack of parallel planar coil subassemblies and the planar coil subassemblies are stacked face-to-face, with fiducial pins that co-locate them, such that the entire magnet coil is assembled by stacking the subassemblies and compressing them stably either by metal fixtures or welding.

6. The structure of claim 5, wherein each subassembly consists of a set of coil elements that are coplanar and are nested sequentially in radius, and further wherein each subassembly contains a baseplate and a set of removable metal hoops, each shaped to define the inner boundary of a particular coil element.

7. The structure of claim 6, wherein the baseplate is machined with a set of grooves such that each hoop fits into a groove in the baseplate.

* * * * *